(12) United States Patent  (10) Patent No.: US 8,143,128 B2
Herman et al.                (45) Date of Patent:    Mar. 27, 2012

(54) MULTILAYER DIELECTRIC DEFECT METHOD

(75) Inventors: Gregory S. Herman, Albany, OR (US); Peter Mardilovich, Corvallis, OR (US); Randy L. Hoffman, Corvallis, OR (US); Laura Lynn Kramer, Corvallis, OR (US); Kurt M. Ulmer, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/833,354

(22) Filed: Jul. 9, 2010

(65) Prior Publication Data

US 2010/0279514 A1    Nov. 4, 2010

Related U.S. Application Data

(63) Continuation of application No. 11/830,533, filed on Jul. 30, 2007, now Pat. No. 7,768,080.

(51) Int. Cl.
    *H01L 21/471*    (2006.01)
(52) U.S. Cl. .. 438/287; 438/781; 438/782; 257/E21.493
(58) Field of Classification Search ........... 257/E21.493, 257/E21.494
    See application file for complete search history.

(56) References Cited

U.S. PATENT DOCUMENTS

| | | | |
|---|---|---|---|
| 5,328,861 A | 7/1994 | Miyakawa | |
| 5,334,544 A | 8/1994 | Matsuoka | |
| 5,506,177 A * | 4/1996 | Kishimoto et al. | 438/624 |
| 5,960,289 A | 9/1999 | Tsui et al. | |
| 6,150,668 A | 11/2000 | Bao et al. | |
| 6,215,130 B1 | 4/2001 | Dodabalapur | |
| 6,232,157 B1 | 5/2001 | Dodabalapur et al. | |
| 6,277,679 B1 | 8/2001 | Ohtani | |
| 6,512,269 B1 | 1/2003 | Bryant | |
| 6,521,489 B2 | 2/2003 | Duthaler et al. | |
| 6,642,092 B1 | 11/2003 | Voutsas et al. | |
| 6,720,221 B1 | 4/2004 | Ahn et al. | |
| 6,764,885 B2 | 7/2004 | Huang et al. | |
| 6,765,249 B2 | 7/2004 | Voutsas et al. | |
| 6,767,775 B1 | 7/2004 | Yudasaka et al. | |
| 6,806,542 B1 * | 10/2004 | Zhang et al. | 257/411 |
| 7,011,996 B2 | 3/2006 | Okumura et al. | |
| 7,737,006 B2 | 6/2010 | Colfer et al. | |
| 2002/0090768 A1 | 7/2002 | Assaderaghi | |
| 2002/0113264 A1 | 8/2002 | Horikoshi | |
| 2002/0115252 A1 | 8/2002 | Haukka | |
| 2003/0214044 A1 * | 11/2003 | Jang et al. | 257/758 |
| 2004/0032001 A1 | 2/2004 | Gilmer et al. | |
| 2004/0041239 A1 | 3/2004 | Ruelke et al. | |
| 2005/0242330 A1 | 11/2005 | Herman | |
| 2007/0215918 A1 | 9/2007 | Ito et al. | |

FOREIGN PATENT DOCUMENTS

JP    2005-336524    8/2005

OTHER PUBLICATIONS

International Search Report dated Feb. 24, 2006 for PCT/US2005/033947.

* cited by examiner

*Primary Examiner* — Stephen W Smoot

(57) ABSTRACT

A method forms a first inorganic dielectric layer having a first concentration of defects and a second inorganic dielectric layer in contact with a first layer and having a second lesser concentration of defects.

25 Claims, 5 Drawing Sheets

MULTILAYER DIELECTRIC DEFECT METHOD

CROSS-REFERENCE TO RELATED PATENT APPLICATIONS

The present application is a continuation application filed under 37 C.F.R. 1.53(b) and claims priority from U.S. application Ser. No. 11/830,533, filed on Jul. 30, 2007 now U.S. Pat. No. 7,768,080 issued on Aug. 3, 2010 and entitled MULTILAYER DIELECTRIC by Gregory S. Herman, Peter Mardilovich, Randy L. Hoffman, Laura Lynn Kramer and Kurt M. Ulmer, the full disclosure of which is hereby incorporated by reference.

The present application is related to U.S. patent application Ser. No. 10/972,229 filed on Oct. 22, 2004 by Herman et al. and entitled ELECTRONIC ISOLATION DEVICE, the full disclosure of which is hereby incorporated by reference.

BACKGROUND

Electronic devices, such as integrated circuits, smart packages and electronic displays, for example, may comprise one or more components, such as one or more thin film transistors (TFTs). Methods and/or materials utilized to form devices and/or components such as these may vary, and one or more of these methods and/or materials may have particular disadvantages. For example, use of such methods and/or materials may be time-consuming and/or expensive, may preclude the use of particular materials, and/or may not produce devices and/or components having the desired characteristics.

DETAILED DESCRIPTION OF THE EXAMPLE EMBODIMENTS

Figure 1:
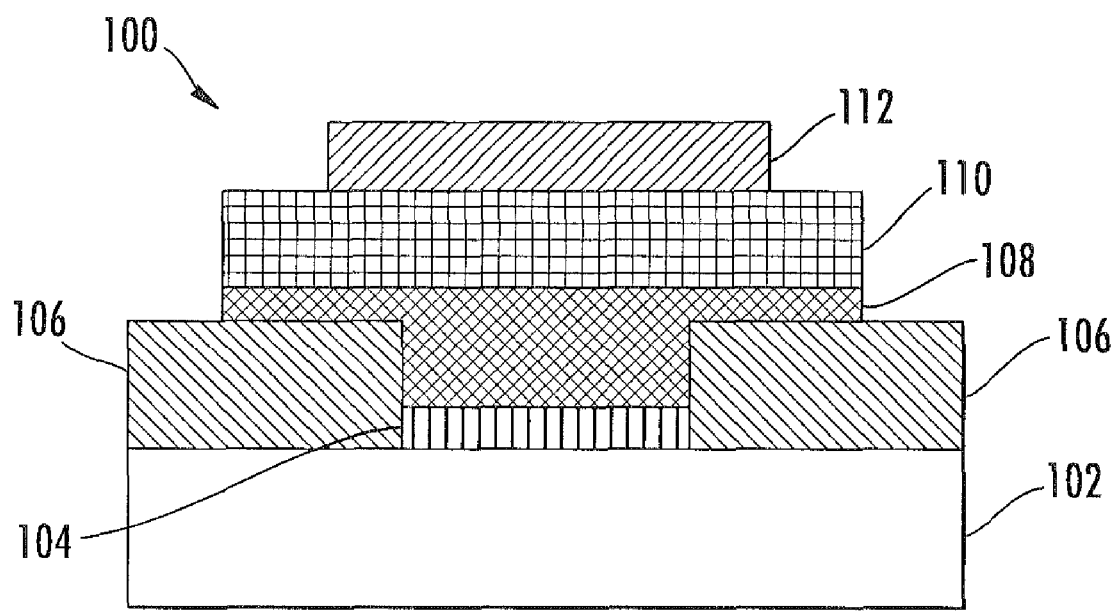
FIG. 1 is a cross sectional view of one embodiment of a component according to an example embodiment.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and dielectric devices, for example, may comprise one or more electronic components. The one or more electronic components may comprise one or more thin film components, which may be comprised of one or more thin films. In this context, the term thin film refers to a layer of one or more materials formed to a thickness, such that surface properties of the one or more materials may be observed, and these properties may vary from bulk material properties. Thin films may additionally be referred to as component layers, and one or more component layers may comprise one or more layers of material, which may be referred to as material layers, for example. The one or more material and/or component layers may have particular electrical and chemical properties, such as conductivity, chemical interface properties, charge flow, and/or processability, for example. The one or more material and/or component layers may additionally be patterned, for example. The one or more material and/or component layers, in combination with one or more other material and/or component layers may form one or more electrical components, such as thin film transistors (TFTs), capacitors, diodes, resistors, photovoltaic cells, insulators, conductors, optically active components, or the like. Components such as TFTs, in particular, may, for example, be utilized in devices including smart packages and/or display devices including, for example, radio frequency identification (RFID) tags, one or more types of sensors, and electroluminescent and/or liquid crystal displays (LCD), such as active matrix liquid crystal display (AMLCD) devices, for example.

At least as part of the fabrication process of electronic components such as thin film components, including, for example, thin film transistors, one or more layers of material may be formed at least as part of one or more of the component layers. One or more component layers may comprise a channel layer, one or more electrodes, and/or a dielectric layer, if the thin film component comprises a thin film transistor, for example. In one embodiment, as at least a part of the fabrication process, one or more material layers may be formed by use of one or more formation processes, and/or by use of one or more materials, such as a combination of materials, for example. In one particular embodiment, at least a portion of a component, such as a thin film component, may be formed by use of one or more processes. At least one of the processes may be referred to as solution processing, for example. Solution processing, as used in this context, comprises one or more processes, wherein a solution, such as a substantially liquid solution, and/or a solid or solid precursor that may be at least partially dissolved in a liquid, for example, may be deposited on one or more surfaces of a component, such as on one or more surfaces of a substrate, by use of one or more deposition processes. Components, such as electronic components, including TFTs, for example, which may be at least partially formed by one or more processes such as solution processes may be referred to as solution processed components, for example. In one embodiment of solution processing, an ejection mechanism, such as an ink jet device, may deposit and/or jet one or more materials, such as a liquid, onto a surface, in order to substantially form a material layer, for example. Additionally, one or more spin coating processes and/or one or more contact printing processes, wherein one or more printing devices may be capable of printing materials, such as liquid materials, on to a surface, may be utilized in one or more embodiments of solution processing, although these are just a few examples, and claimed subject matter is not so limited. For example, one or more dip coating processes, spray coating processes, curtain coating processes, screen printing processes, chemical bath deposition processes and/or successive ionic layer absorption and reaction processes may be utilized in one or more embodiments of solution processing. Additionally, as used herein, an ejection device, such as a jetting device, including an ink jet device capable of performing ink jetting, may comprise a mechanism capable of ejecting material such as liquid, including a solution, for example, and may eject material in the form of drops, for example, such as mechanically and/or electrically, and/or in response to electrical signals, and may be capable of ejecting material in controlled portions, in a controlled manner, and/or in a controlled direction, for example. Additionally, an ejection device may operate by use of one or more ejection schemes, including piezo ejection, thermal ejection, continuous ejection, acoustic ejection and/or flex tensioned ejection, for example, but, again, claimed subject matter is not limited to these examples.

Although claimed subject matter is not so limited, in one particular embodiment, an electronic component, such as a thin film component, may comprise at least one component layer, wherein the at least one component layer comprises two or more layers of material, such as differing material and/or material having differing characteristics, for example. In at least one embodiment, at least a portion of the component may be conductive, semiconductive, and/or insulative, for example, and, in at least one embodiment, a dielectric layer may be formed as part of a component, wherein the dielectric layer comprises at least two material layers. In this embodiment, at least two of the material layers may substantially comprise inorganic material, for example. It is worthwhile to note that claimed subject matter is not limited in scope to a component having two material layers, and/or a component layer comprising two layers of inorganic material. For example, one or more layers of material may be formed between the at least two inorganic material layers, such as additional inorganic material layers, for example, and use of additional material layers other than the at least two inorganic layers may depend at least in part on the particular component being formed, for example.

Formation of a component such as a thin film transistor having a dielectric layer, wherein the dielectric layer comprises two or more inorganic material layers may provide a component having one or more desirable characteristics, such as one or more characteristics that a component not having two or more inorganic material layers may not have, for example. In one embodiment, the two or more inorganic material layers may comprise differing materials, and/or may have differing properties, such as differing physical, chemical and/or electrical properties, including, for example, electrical interface properties, breakdown field properties and/or current leakage properties, as just a few examples, which may affect semiconductor properties such as mobility, stability and/or turn-on voltages. Additionally, one or more of these materials may have particular advantages and/or disadvantages with reference to deposition. For example, in one embodiment, inorganic materials that may exhibit one or more desirable characteristics, such as desirable chemical and/or electrical interface characteristics, such as desirable film quality, dielectric strength, and/or charge transport properties, which may aid reliability, for example, may be comparatively difficult to process, such as by necessitating the use of high temperature processing. Conversely, one or more types of inorganics, including amorphous and/or glass-like inorganic materials may be more readily processed, but may not exhibit desirable properties including electrical interface properties, for example. In this context, the term glass-like refers generally to a material having one or more properties of glass, such as control over viscosity, remaining substantially non-crystalline when solidified, and insulating, for example.

In at least one embodiment, the two or more inorganic materials may have differing properties, such as by one material having one or more desirable electrical interface properties, but not having particularly desirable electrical integrity properties and/or processability, for example, and by a second material having one or more desirable electrical integrity properties and or processability, but not having particularly desirable electrical interface properties, as just an example. Utilization of at least these two materials may provide the capability to select the differing materials, material configurations and/or processes to produce a component having desirable characteristics, such as by forming a dielectric layer by depositing a first dielectric material having one or more desired electrical interface properties on a channel layer by use of one or more processes, whereby a dielectric layer/channel layer interface is formed, and depositing a second dielectric material having one or more desired electrical properties over at least a portion of the first dielectric material by use of one or more processes, as just one potential example. Thus, a dielectric layer may be formed from two or more inorganic materials and/or by use of two or more processes, wherein the dielectric layer may exhibit one or more properties that a dielectric layer not formed from two or more inorganic materials may not exhibit, for example.

Referring now to FIG. 1, there is illustrated a cross-sectional view of one embodiment 100 of an electronic component in a stage of formation. Electronic component 100, here, may comprise an electronic component formed by use of one or more deposition processes, such as solution processes, for example, and may comprise a portion of a display device, such as a portion of an active-matrix liquid crystal display (AMLCD) device, such as a backplane, and/or a portion of a smart package, such as an RFID tag, as just a few examples. Embodiment 100, here, comprises substrate 102, with one or more component layers 104, 106, 108, 110 and/or 112 formed thereon. In one particular embodiment, component layer 104 may comprise a channel layer; component layer 106 may comprise an electrode layer, and may further comprise one or more drain and/or source electrodes, for example; component layer 108 may comprise a first portion of a dielectric layer; component layer 110 may comprise a second portion of a dielectric layer, wherein said first and second portions may be formed from inorganic material, such as differing inorganic materials, as explained previously; and component layer 112 may comprise a conducting gate layer, which may include a gate electrode, for example. Additionally, one or more of the source and/or drain electrodes 106 may be electrically coupled to the channel layer 104, and at least a portion of the conducting gate layer 112 may be electrically coupled to one or more portions 108 and/or 110 of the dielectric layer, and, in this particular configuration, component 100 may be referred to as a top gate thin film transistor, which may refer to a transistor configured to have a gate layer formed on or over a dielectric layer, for example, although it is worthwhile to note that this is just one embodiment, and claimed subject matter is not limited in this respect, but may comprise other configurations such as a bottom gate transistor, explained in more detail with reference to FIG. 2. Additionally, it is noted here and throughout this description that claimed subject matter is not limited to the foregoing material and/or component layers being formed on one another. For example, other layers may be included, such as intervening layers formed between various layers, so that layers may be formed above or over one another rather than on one another, depending, for example, on the particular embodiment.

Figure 2:
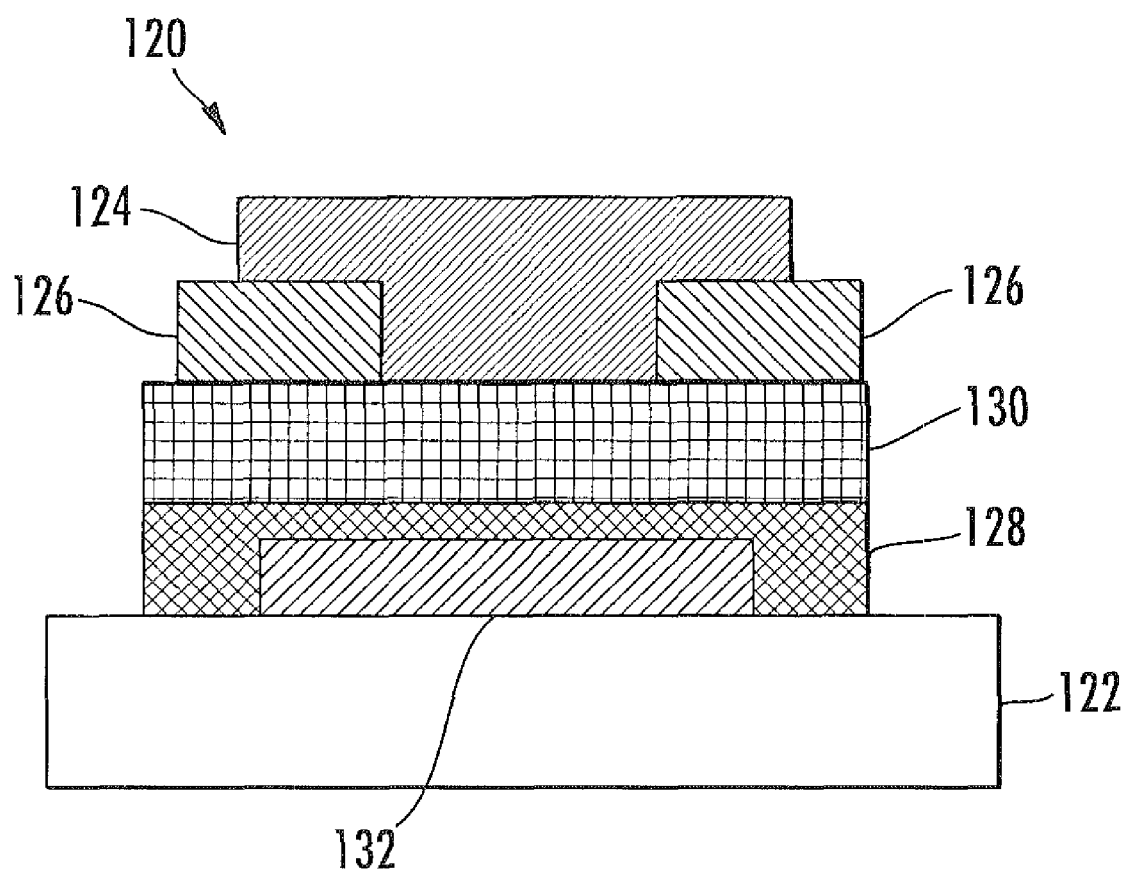
FIG. 2 is a cross sectional view of one embodiment of the component of FIG. 1 according to an example embodiment.

Referring now to FIG. 2, there is illustrated a cross-sectional view of one embodiment 120 of an electronic component in a stage of formation. Electronic component 120, similar to embodiment 100, may comprise an electronic component formed by use of one or more processes and/or materials, such as by forming component 120 to have a dielectric layer comprising two or more inorganic materials, for example, and may comprise a portion of a display device, such as a portion of an AMLCD device, such as a backplane, and/or a portion of a smart package, such as an RFID tag, as just a few examples. Embodiment 120, here, comprises substrate 122, with one or more component layers 124, 126, 128 130 and/or 132 formed thereon. In one particular embodiment, component layer 124 may comprise a channel layer; component layer 126 may comprise an electrode layer, and may further comprise a drain and/or source electrode, for example; component layers 128 and 130 may each comprise a portion of dielectric layer wherein each portion may be formed from inorganic material, such as differing inorganic materials, as explained previously; and component layer 132 may comprise a gate electrode layer, and, in this particular configuration, component 120 may be referred to as a bottom gate thin film transistor, which may refer to a transistor configured to have a gate electrode layer formed on or over a substrate, and a dielectric layer formed over the gate electrode layer, for example. Additionally, similar to embodiment 100, it is noted that claimed subject matter is not limited to the foregoing material and/or component layers being formed on one another. For example, other layers may be included, such as intervening layers formed between various layers, so that layers may be formed above or over one another rather than on one another, depending, for example, on the particular embodiment.

Although claimed subject matter is not limited to any particular material and/or combination of materials to form one or more of the layers and/or components illustrated in FIGS. 1 and/or 2, in at least one embodiment, one or more of the component layers may comprise one or more of the materials described below. Additionally, it is worthwhile to note that claimed subject matter is not limited in this respect, and one or more of the component layers may comprise any material or combination of materials that may be suitable for use as one or more component layers, including materials exhibiting properties suitable for application as one or more component layers in an electronic component, for example. However, in this embodiment, where component layers 102 and/or 122 comprise a substrate layer, component layers 102 and/or 122 comprise may comprise one or more materials suitable for use as a substrate, including, for example, silicon, silicon dioxide, one or more types of glass, one or more organic substrate materials, such as polyimides (PI), including Kapton®, polyethylene terephthalates (PET), polyethersulfones (PES), polyetherimides (PEI), polycarbonates (PC), polyethylenenaphthalates (PEN), acrylics including polymethylmethacrylates (PMMA) and combinations thereof, for example, but claimed subject matter is not so limited. Additionally, substrate layer 102 may also comprise one or more inorganic materials, including silicon, silicon dioxide, one or more types of glass, stainless steel and/or metal foils, including foils of aluminum and/or copper, for example, but claimed subject matter is not so limited. Additionally, in at least one embodiment, wherein a substrate material is substantially comprised of one or more metals, an insulator layer may be utilized in addition to the one or more metals to form the substrate, for example. Additionally, in at least one embodiment, wherein a substrate material is substantially comprised of one or more metals, an insulator layer may be utilized in addition to the one or more metals, for example. Additionally, in this particular embodiment, component layers 104 and/or 124 may comprise channel layers. Component layers 104 and/or 124 may be comprised of one or more materials suitable for use as a channel layer, including, for example, metal oxides such as zinc oxide, tin oxide, indium oxide, gallium oxide, cadmium oxide, lead oxide, copper oxide, silver oxide and combinations thereof; silicon, including amorphous, nanowire, microribbon, and/or polycrystalline silicon; carbon nanotubes, GaAs, Ge, CdS, CdSe, ZnS, ZnSe, $SnS_2$, $SnSe_2$, and/or combinations thereof, for example. In this embodiment, wherein component layers 106 and/or 126 comprise electrode layers, and may be comprised of one or more source and/or drain electrodes, for example, at least a portion of component layers 106 and/or 122 may be substantially comprised of indium tin oxide; other doped oxide semiconductors, such as n-type doped zinc oxide, indium oxide, and/or tin oxide, and/or metals, such as Al, Ag, In, Sn, Zn, Ti, Mo, Au, Pd, Pt, Cu, W, Ni and combinations thereof, as just a few examples. Additionally, in this embodiment, wherein component layers 112 and/or 132 comprise gate layers, component layers 112 and/or 132 may be comprised of metals, such as Al, Ag, In, Sn, Zn, Ti, Mo, Au, Pd, Pt, Cu, Ni; indium tin oxide; other doped oxide semiconductors, such as n-type doped zinc oxide, indium oxide, tin oxide, and combinations thereof, as just a few examples.

Continuing with this embodiment, component 100 may comprise a dielectric layer, wherein the dielectric layer may comprise two or more inorganic material layers, illustrated as dielectric layer portion 108 and dielectric layer portion 110. In one embodiment, dielectric layer portion 108 may comprise one or more inorganic materials having one or more properties, such as one or more of the properties described previously. Additionally, dielectric layer portion 110 may comprise one or more inorganic materials having one or more properties, such as one or more of the properties described previously, and one or more of these properties of dielectric layer portion 110 may vary from one or more properties of dielectric layer portion 108, for example. In at least one embodiment, dielectric layer portion 108 may comprise inorganic materials, including $SiO_x$, $AlO_x$, $ZrO_x$, $HfO_x$, $SiN_x$, $SiO_xN_y$, $GeO_x$, $GaO_x$, $SbO_x$, SnOx, TiOx, YOx, LaOx, $Ba_aSr_bTiOx$, $Ba_aZr_bTiOx$, $TaO_x$, and combinations thereof, as just a few examples. Conversely, dielectric layer portion 110 may comprise one or more other inorganic materials, including amorphous and/or glass-like materials, such as one or more metal-oxy-hydroxy-salts, one or more types of glass, including solution processed silicate glasses, alkaline doped silicate glasses, sodium silicates, phosphosilicates, borosilicates, aluminosilicates, oxycarbide glasses, polysiloxanes, one or more glass resins including silsesquioxanes, hafnium-oxy-hydroxy-sulfate ("Hafsox") $(HfO_x(OH)_y(SO_4)_z)$ and combinations thereof, for example. One particular embodiment of Hafsox, which may be employed by at least one embodiment, is set forth in the following patent application, "Dielectric Material", application Ser. No. 10/837,411, filed Apr. 30, 2004, assigned to the assignee of the presently claimed subject matter, although it is worthwhile to note that claimed subject matter is not so limited.

Formation of one or more layers of component 100 of FIG. 1 and/or component 122 of FIG. 2 may comprise one or more processes, and/or numerous process operations, but claimed subject matter is not limited to any particular method of formation of one or more layers and/or one or more electrodes of component 100. However, in at least one embodiment, one or more solution processes may be utilized, such as one or more of the following: one or more ejection processes, including, for example, one or more dip coating processes, spray coating processes, curtain coating processes, screen printing processes, chemical bath deposition processes and/or successive ionic layer absorption and reaction processes, as just a few examples, but again, claimed subject matter is not so limited. Particular methods of formation of the components illustrated herein may be better understood when explained with reference to FIG. 3, below.

Figure 3:
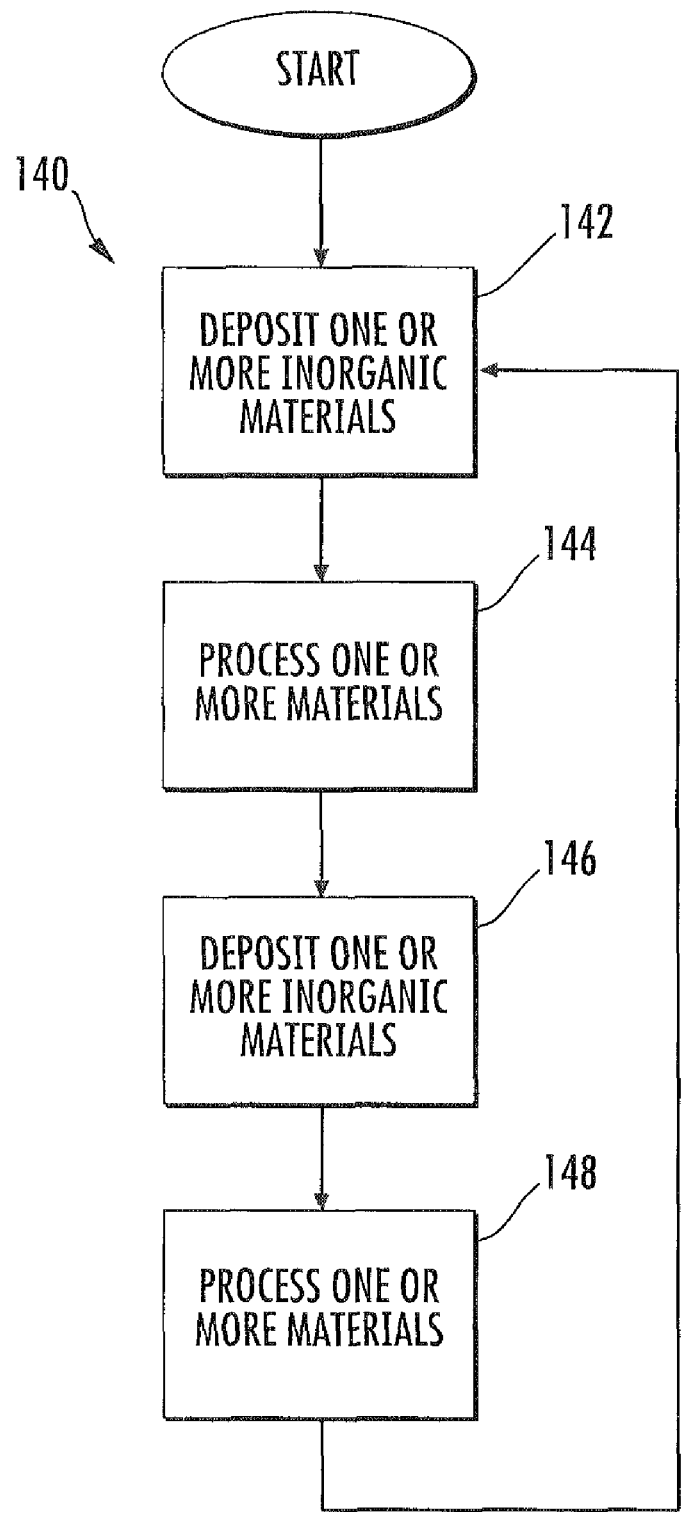
FIG. 3 is a flowchart illustrating one embodiment of a method to form a component according to an example embodiment.

Referring now to FIG. 3, one embodiment of a technique for forming a solution processed transistor having a multi-layer dielectric is illustrated by a flowchart, although claimed subject matter is not limited in scope in this respect. Such an embodiment may be employed to at least partially form a solution processed component, as described below. The flowchart illustrated in FIG. 3 may be used to form a component at least in part, such as component 100 of FIG. 1 and/or component 122 of FIG. 2, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter.

Flowchart 140 depicted in FIG. 3 may, in alternative embodiments, be implemented in a combination of hardware and software and/or firmware, such as part of a computer controlled formation system capable of forming one or more portions of a component, such as component 100 of FIG. 1 and/or component 122 of FIG. 2, for example, and may comprise discrete and/or continual operations. In this embodiment, at block 142, one or more inorganic materials may be deposited on or over at least a portion of substrate, such as substrate 102 and/or 122, for example, and/or may be deposited over one or more other layers of components 100 and/or 120, such as the channel layer and/or one or more electrodes, as just a few examples. At block 144, a portion of the one or more inorganic materials may be processed, such as by selectively removing at least a portion of the one or more organic materials, and/or altering at least a portion of the one or more inorganic materials, explained in more detail later. At block 146, one or more inorganic materials may be deposited on or over at least a portion of the one or more inorganic materials deposited at block 142 and/or over one or more other layers described previously. At block 148, similar to block 144, a portion of the one or more inorganic materials may be processed, such as by selectively removing at least a portion of the one or more organic materials, and/or altering at least a portion of the one or more inorganic materials, explained in a more detail later.

In this embodiment, at block 142, one or more inorganic materials may be deposited on or over at least a portion of a component, such as on one or more layers of a multilayer component, such as component 100 and/or 120, including, for example, a substrate layer, a channel layer, and/or an electrode layer, as just a few examples. As illustrated in FIG. 1, one or more inorganic dielectric materials may be deposited such that at least a portion of a dielectric layer, such as dielectric layer 108, is formed. In this embodiment, one or more inorganic materials, including $SiO_x$, $AlO_x$, $ZrO_x$, $HfO_x$, $SiN_x$, $SiO_xN_y$, $GeO_x$, $GaO_x$, $SbO_x$, SnOx, TiOx, YOx, LaOx, $Ba_aSr_bTiOx$, $Ba_aZr_bTiOx$, $TaO_x$, and combinations thereof, for example, may be formed on or over at least a portion of one or more component layers, such as at least a portion of electrode layer 106, and/or at least a portion of the channel layer 104, and/or at least a portion of the substrate layer 102, although claimed subject matter is not limited in this respect. Additionally, deposition of one or more inorganic materials may comprise one or more solution processes, including, for example, one or more ejection processes, such as one or more jetting processes, including thermal and/or piezo jetting, such as by use of an ink jet component, including a thermal ink jet (TIJ) component, for example. Additionally, one or more inorganic materials may be deposited by use of one or more other solution processes, such as one or more contact printing processes and/or one or more coating processes, such as one or more spin coating processes. Additionally, although numerous materials or combinations of materials may be utilized to form a layer of inorganic material, and the material(s) utilized may depend, at least in part, on the particular process(es) utilized, in one embodiment, the inorganic material may substantially comprise zirconium oxide, and may be deposited by use of one or more thermal jetting processes, as just an example. Additionally, the one or more materials deposited may be in one or more forms, such as in a substantially liquid form, in a nanoparticle suspension form, and/or one or more types of precursor forms, as just a few examples. Additionally, the material(s) deposited may be deposited to a thickness, although the particular thickness may depend at least in part on one or more factors, such as the material(s) utilized to form the one or more sub-layers, the solution concentration, the number of sub-layers being formed, and/or the particular component being formed, for example.

In this embodiment, at block 144, at least a portion of the one or more materials deposited at block 142 may be processed, although, in alternative embodiments, no processing may be performed, for example. Additionally, particular processing performed on the one or more materials may be selected based at least in part on the material(s) utilized to form the material layer, for example, and/or the particular component being formed, for example. In one embodiment, at least a portion of the one or more inorganic materials may be at least partially removed, such as by use of one or more laser ablation and/or chemical etching processes, for example, which may result in at least a portion of the one or more materials being patterned, for example. Additionally, one or more portions may be altered, such as by being cured and/or sintered, for example. Curing, when used in this context, refers generally to a process wherein a liquid precursor is substantially transformed into a substantially solid film, such as an oxide film, and may comprise one or more solvent and/or organic group removal processes, and/or one or more decomposition of metal organic compound processes as a result from heating, for example, such as thermal, laser, microwave and/or other types of radiative heating. Additionally, sintering, when used in this context, refers generally to a process wherein multiple portions of a material, such as a metal oxide material in the form of nanoparticles, for example, may become a substantially singular mass, as a result of melting and re-crystallization, such as result from heating, for example, such as thermal and/or laser heating. Additionally, one or more portions of one or more materials may be altered by being at least partially solidified, crystallized, polymerized, patterned, and/or having the density altered, but, again, particular processing performed on the one or more materials may be selected based at least in part on the material(s) utilized to form the material layer, for example, and/or the particular component being formed, for example.

In this embodiment, at block 146, one or more inorganic materials may be deposited on at least a portion of a component, such as on one or more inorganic materials deposited at block 142, for example. In this embodiment, one or more inorganic materials may comprise one or more amorphous and/or glass-like materials including one or more metal-oxy-hydroxy-salts, one or more types of glass, including solution processed silicate glasses, alkaline doped silicate glasses, sodium silicates, phosphosilicates, borosilicates, aluminosilicates, oxycarbide glasses, polysiloxanes, one or more glass resins including silsesquioxanes, hafnium-oxy-hydroxy-sulfate ($HfO_x(OH)_y(SO_4)_z$), and combinations thereof, as just a few examples, and may be formed on at least a portion of the inorganic material deposited at block 142, although claimed subject matter is not limited in this respect, and at least a portion of the inorganic material may be deposited on one or more other component and/or material layers, for example. Deposition of one or more inorganic materials may comprise one or more solution processes, including, for example, one or more ejection processes, such as one or more jetting processes, including thermal and/or piezo jetting, such as by use of an ink jet component, including a TIJ component, for example. Additionally, one or more inorganic materials may be deposited by use of one or more solution processes, such as one or more of the processes described with reference to block 142, for example. Additionally, although numerous materials or combinations of materials may be utilized to form a layer of inorganic material, and the material(s) utilized may depend, at least in part, on the particular process(es) utilized, in one embodiment, the inorganic material may substantially comprise hafnium-oxy-hydroxy-sulfate, and may be deposited by use of an ejection mechanism, for example.

However, continuing with this embodiment, at block 148, at least a portion of the one or more materials deposited at block 146 may be processed, although, in alternative embodiments, no processing may be performed, for example. Additionally, particular processing performed on the one or more materials may be selected based at least in part on the material(s) utilized to form the material layer, for example, and/or the particular component being formed, for example. In one embodiment, at least a portion of the one or more inorganic materials may be at least partially removed, such as by use of one or more laser ablation processes, for example, which may result in at least a portion of the one or more materials being patterned, for example. Additionally, one or more portions may be cured and/or sintered, for example. Thus, a component comprising a dielectric layer, wherein the dielectric layer comprises multiple inorganic materials deposited by use of solution processing may be formed, and the component may exhibit one or more characteristics, such as described previously.

As described in some detail previously, such as a dielectric layer wherein at least a portion of the dielectric layer comprises two or more layers of inorganic material, and at least a portion of the two or more layers may be solution processed may result in the formation of a dielectric layer, and/or a component having particular characteristics that may vary from a component not being formed in this manner and/or from this particular combination of materials. For example, a dielectric layer of a thin film transistor may be formed in this manner, and may result in the formation of a thin film transistor having desirable characteristics, such as by having desirable physical, chemical and/or electrical properties, including, for example, electrical interface properties such as mobility, stability and/or turn-on voltages, electrical integrity properties including breakdown field properties and/or current leakage properties, desirable film quality, channel mobility capabilities, and/or charge transport properties, which may aid reliability, for example, and/or desirable processability properties, as just a few examples. However, it is worthwhile to note that one or more embodiments described herein are not limited in this respect, and may have differing and/or additional properties as compared to those described above, for example.

It is now appreciated, based at least in part on the foregoing disclosure, that a combination of hardware and software and/or firmware may be produced capable of performing a variety of operations described with reference to FIG. 3, which may be implemented in a system suitable for forming a component having a multilayer dielectric layer, as described previously. It will additionally be understood that, although particular embodiments have just been described, claimed subject matter is not limited in scope to a particular embodiment or implementation. For example, a system capable of implementing one or more of the foregoing operations described in reference to FIG. 3 may comprise hardware, such as implemented to operate on a device or combination of devices as previously described, for example, whereas another embodiment may be in software and hardware, for example. Likewise, an embodiment of a system capable of implementing one or more of the abovementioned operations may be implemented in firmware, or as any combination of hardware and software and/or firmware, for example. Additionally, all or a portion of one embodiment may be implemented to operate at least partially in one device, such as an ejection device, a laser device, a display, a computing device, a set top box, a cell phone, and/or a personal digital assistant (PDA), for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, a set top box, a cell phone, and/or a personal digital assistant (PDA), and/or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more types of memory, such as static random access memory, dynamic random access memory, flash memory, and/or a hard drive, although, again, claimed subject matter is not limited in scope to this example.

Figure 4:
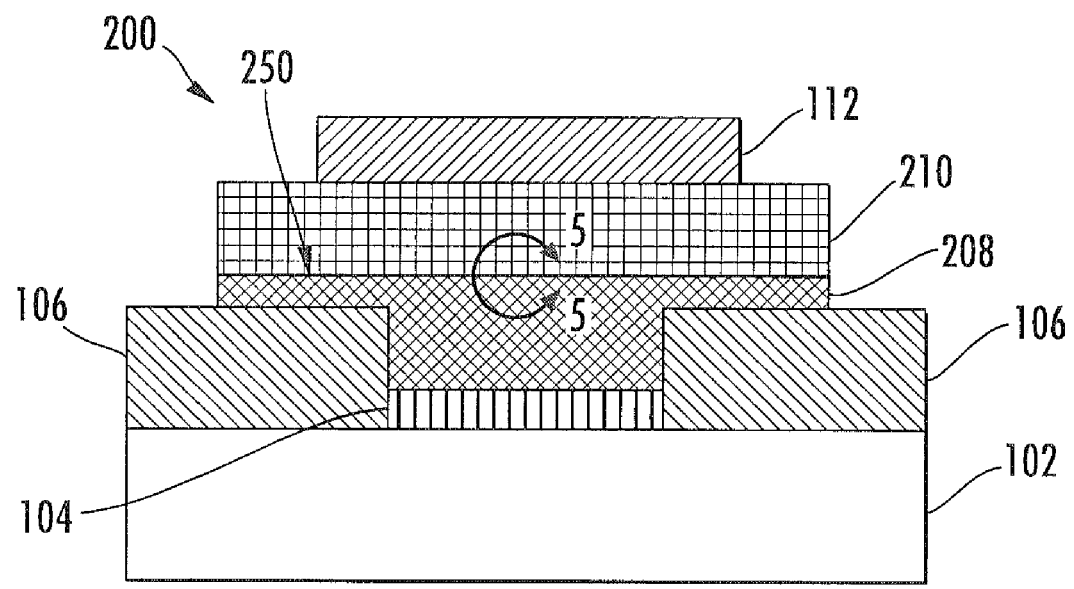
FIG. 4 is a cross-sectional view of another embodiment of the component of FIG. 1 according to an example embodiment.

FIG. 4 is a cross-sectional view of component 200 (shown as a thin film transistor (TFT)), another embodiment of component 100 in a stage of formation. Component 200 is similar to component 100 except that component 200 includes component layers 208 and 210, specific embodiments of layers 108 and 110 described above with respect to component 100. Those remaining layers of component 200 which correspond to layers of component 100 are numbered similarly.

Component layers 208 and 210 synergistically cooperate with one another to enhance or increase the electric resistance provided by such dielectric layers. In particular, layer 208 is formed by depositing, using one or more solution processes (e.g., drop-on-demand inkjet printing), a solution or liquid precursor that includes one or more inorganic dielectric materials. The precursor solution is treated to drive off or evaporate solvent or other materials to solidify the solution and form layer 208. Component layer 210 is similarly formed by depositing on the solidified layer 208, using one or more solution processes, a solution or liquid precursor including one or more inorganic dielectric materials. The precursor solution deposited upon layer 208 is treated to drive off or evaporate solvent or other materials to solidify the solution and form layer 210. However, the particular inorganic dielectric materials chosen for layers 208 and 210 and/or the processes employed for curing or solidifying layers 208 and 210 are different. In particular, the materials chosen for layers 208 and 210 and/or the processes employed for curing or solidifying layers 208 and 210 are such that layer 208 has a greater specific resistance as compared to that of layer 210, yet the probability of dielectric failure (for example, excessive gate-to-source or gate-to-drain current flow) for a thin-film transistor employing layers 208 and 210, collectively, is smaller than that seen using layer 208 alone (that is to say, the relative fraction of "good" devices, commonly referred to as "yield", is improved by using layers 208 and 210 in combination, as compared to that attained using layer 208 alone). This is achieved by layer 210 healing cracks or defects within layer 208 along interface 250 that may result from the processes or materials which themselves provided layer 208 with its greater specific resistance. Specific resistance ($\rho$) is the amount of electrical resistance per unit of length divided by the cross-sectional area (i.e., $\rho=R/[L/A]$). Because layers 208 and 210 cooperate to provide enhanced electrical resistance properties, specifically as measured by the probability of TFT failure due to gate leakage and/or shorting (excessive gate-to-source or gate-to-drain current flow), between electrodes 106 and 112 and between channel layer 104 and electrodes 112, transistor performance is also enhanced.

According to one embodiment, layer 208 is provided with an enhanced specific electric resistance by driving off a greater percentage or amount of solvents, cations and/or organometallics from the deposited inorganic dielectric precursor solution as compared to the amount of the solvents, cations and/or organometallics driven off from the inorganic dielectric precursor solution of layer 210. For example, layer 208 may have greater energy applied to it during solidification or curing such as being heated at a greater temperature or intensity or for a longer period of time as compared to layer 210. In particular embodiments, layer 210 may be under cured. As a result, layer 208 has a lesser degree, percent, concentration, density or amount of such solvents, cations and/or organometallics as compared to layer 210. Consequently, layer 208 has a greater degree of densification, crystallization, and/or stress during curing or solidification, resulting in crack formation leading to a relatively reduced specific electrical resistance. Because layer 210 has a greater degree of the solvents, cations and/or organometallics, layer 210 also has a greater degree of ligands which otherwise frustrate the forming of crystals during curing or solidification. As a result, layer 208 has a greater degree of densification and/or crystallinity and a lesser degree of amorphousness as compared to layer 210. Because layer 210 is less crystalline or is more amorphous, layer 210 is better adapted to seal, fill or heal cracks in layer 208 which may form in layer 208 as the greater degree of solvents, cations and/or organometallics are driven off during curing or solidification.

Figure 5:
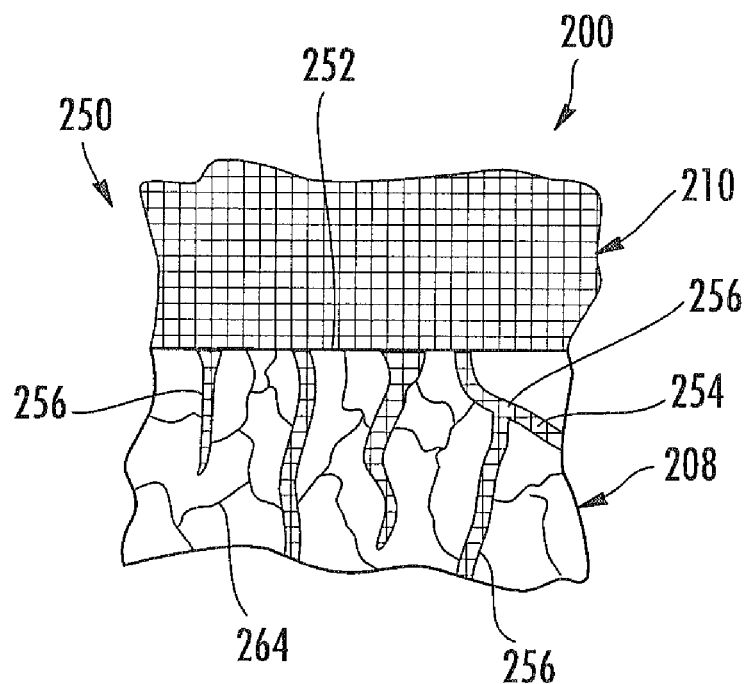
FIG. 5 is an enlarged fragmentary cross sectional view of the component of FIG. 4 taken along line 5-5 according to an example embodiment.

FIG. 5 is an enlarged sectional view illustrating interface 250 between layers 208 and 210 in more detail. As shown by FIG. 5, interface 250 comprises the general juncture or boundary 252 and adjacent regions between layers 208 and 210. At least along interface 250, component layer 208 includes defects 254 which extend from boundary 252 in directions away from layer 210. For purposes of this disclosure, the term "defect" shall mean any discontinuity, gap, void, pin-hole, break or crystalline boundary within an otherwise continuous, homogenous or amorphous layer of one or more materials. A "defect" may comprise a fissure, break, rift, slit, porous defect, crystalline grain boundary and the like.

In the particular example shown in FIG. 5, defects 254 in layer 208 along interface 250 comprise gaps or openings which extend from boundary 252. Some of defects 254 terminate prior to reaching an opposite surface of layer 208. Other of such defects 254 continuously extend from boundary 252 of layer 208 to an opposite surface of layer 208, such as either adjacent to electrodes 106 or channel 104. Some of defects 254 are interconnected with other defects 254 such that defects 254, collectively, extend from boundary 252 to an opposite surface of layer 208. Defects 254 may be the product of curing of layer 208, wherein defects 254 are formed as solvents or other solution fluids are driven off and as layer 208 is solidified during forming of layer 208. This result is sometimes referred to as "mud caking". Although layer 210 is illustrated as omitting any such defects, in other embodiments, depending upon the material chosen for layers 208 and 210 and the processes used to solidify or cure layers 208 and 210, layer 210 may also include some defects 254. However, in such other embodiments, layer 210 has a substantially lesser degree or extent of such defects 254 as compared to layer 208.

As shown by FIG. 5, the one or more materials of inorganic dielectric layer 210 extend across defects 254 at least along interface 250. In addition, the one or more materials of inorganic dielectric layer 210 form fingers, projections or extensions 256 which at least partially fill defects 254 at least partially along interface 250. Extensions 256 are generally homogenous or integral as part of a single unitary body with layer 210. Extensions 256 are formed by the one or more materials of layer 210 flowing into defects 254 while the one or more materials of layers 210 are in a fluid state. Upon solidification or curing of the precursor solution forming layer 210, extensions 256 also become solidified or cured and remain within defects 254. Extensions 256 function to seal or heal layer 208 by extending across and closing off defects 254 and/or by at least partially filling defects 254. Because extensions 256 extend across and at least partially fill defects 254, extensions 256 reduce the potential for electrical current (movement of electrons) through and along defects 254. As a result, the collective electrical resistance or insulation provided by layers 208 and 210 is enhanced.

As shown by FIG. 5, interface 250 may additionally include defects 264. Defects 264 may generally be the result of crystallization of layer 208. Defects 264 generally comprise crystalline grain boundaries. Defects 264 may have widths substantially less than the widths of defects 254. For example, defects 264 may have widths in the order of angstroms. Like defects 254, defects 264, unless sealed or healed, may provide leakage pathways for electrical current, reducing the effective insulating properties of layer 208. In the example illustrated, the one or more inorganic dielectric materials of layer 210 may seal across such defects 264. Because layer 210 has a lesser degree of defects 254 or defects 264 (due to a lesser extent of crystallinity) or because layer 210 substantially omits defects 254 or defects 264, layer 210 effectively seals across such defects 264 by reducing the likelihood of such defects 264 in layer 208 interfacing with or making contact with defects 254 or defects 264 in layer 210 which would potentially increase the leakage pathway for electrical current across layers 208 and 210. As a result, the collective electrical resistance or insulative properties of layers 208 and 210 is enhanced.

Although layer 208 is illustrated as including both defects 254 and defects 256, in other embodiments, depending upon the material chosen for layer 208 and depending upon the processes employed for solidifying or curing layers 208, layer 208 may alternatively include one of defects 254 and defects 264. For example, layer 208 may be formed from one or more inorganic dielectric precursor solutions which upon solidifying or curing do not form defects 254 but which crystallize to form defects 264. Likewise, layer 208 may be formed from one or more inorganic dielectric precursor solutions which upon solidifying or curing form defects 254 as solvents or other precursor materials are driven off (e.g., evaporated or vaporized), yet layer 208 does not substantially crystallize to form defects 264.

According to one example embodiment, layers 208 and 210 are formed from substantially the same inorganic dielectric precursor solution, wherein a lesser amount of energy, such as a lower curing temperature, is applied to the precursor solution forming layer 210 as compared to the curing temperature applied to the precursor solution of layer 208. According to another example embodiment, layers 208 and 210 are formed from different inorganic dielectric precursor solutions. In particular embodiments where layers 208 and 210 are formed from different inorganic dielectric precursor solutions, curing or solidification of layers 208 and 210 and performed at the same curing temperature for the same period of time, wherein the different inorganic dielectric materials for layers 208 and 210 are such that layer 208 cures or solidifies in a shorter period of time or solidifies or crystallizes to a greater extent as compared to layer 210 when cured or solidified with the same process as applied to layer 210.

According to one example embodiment, layers 208 and 210 are both formed from a precursor solution for inorganic dielectric Zirconium oxide. The precursor solution forming layer 208 is solidified or cured by heating the solution at a temperature of about 500 degrees Celsius for an amount of time. The precursor solution forming layer 210 is solidified or cured by heating the solution at a temperature of about 300 degrees Celsius for the same amount of time. During the solidification forming of layer 208, solvents, such as water, cations and organometallics are substantially driven off. Oxygen replaces ligands in the solution such that crystallization of layer 208 is facilitated. $ZrO_2$ results.

In contrast, layer 210 is relatively under cured. This results in layer 210 having a greater degree of water, cations and organometallics, having a greater degree of ligands and having a greater degree of amorphousness (a lower degree of crystallinity) as compared to layer 208. Layer 210 has a greater concentration of mobile ions. Although layer 210 may have a lower specific electrical resistance as compared to a more complete or fully cured layer 208, layer 210 sufficiently heals defects in layer 208 to synergistically enhance the insulative dielectric properties of layers 208 and 210, in combination. A variation of this approach is to use the same layers 208 and 210 but using a much thinner layer of 208 so that stress in the film is reduced upon curing resulting in lower crack formation, and a thicker layer 210 can be deposited on top to increase dielectric breakdown strength.

In other embodiments, layers 208 and 210 may be formed from precursor solutions including differing inorganic dielectric materials. For examples, layers 208 and 210 may be formed from precursor solutions including one or more of the inorganic dielectric materials described above for forming layers 108 and 110, respectively. Examples of materials for layer 208 include $SiO_x$, $AlO_x$, $ZrO_x$, $HfO_x$, and $SiN_x$. Examples for materials of layer 210 include $HfO_x(OH)_y(SO_4)_z$, other metal-oxy-hydroxy-salts, solution processed glasses, and glass resins (silsesquioxanes). Appropriate combinations of inorganic dielectric materials may be used for layers 208 and 210 such that layers 208 and 210 may be solidified or cured from their initial precursor solutions using substantially the same curing or solidification temperatures and times or processes.

Figure 6:
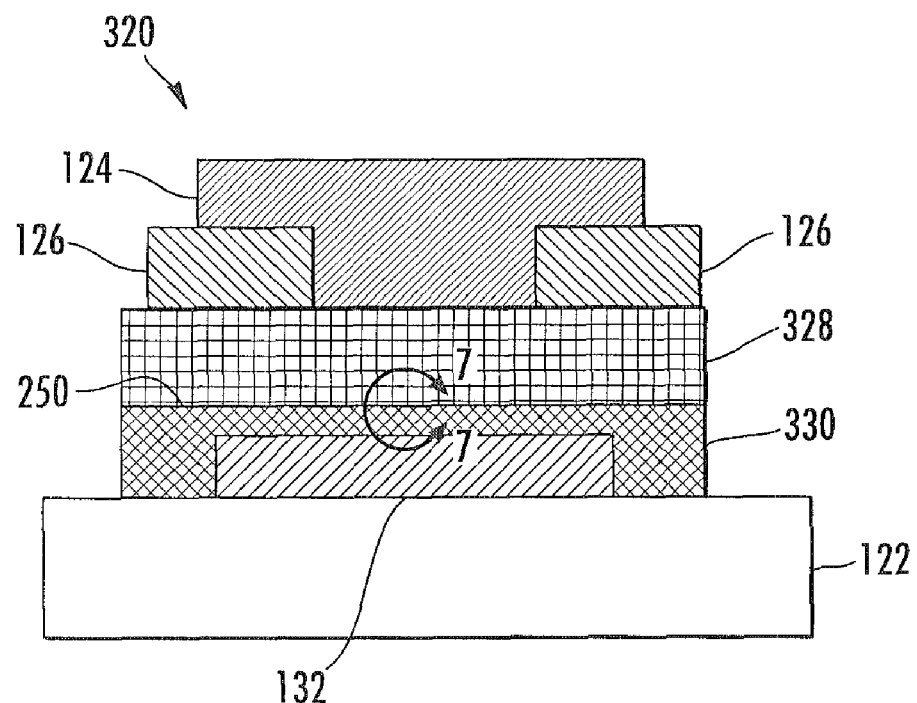
FIG. 6 is a cross-sectional view of another embodiment of the component of FIG. 1 according to an example embodiment.
Figure 7:
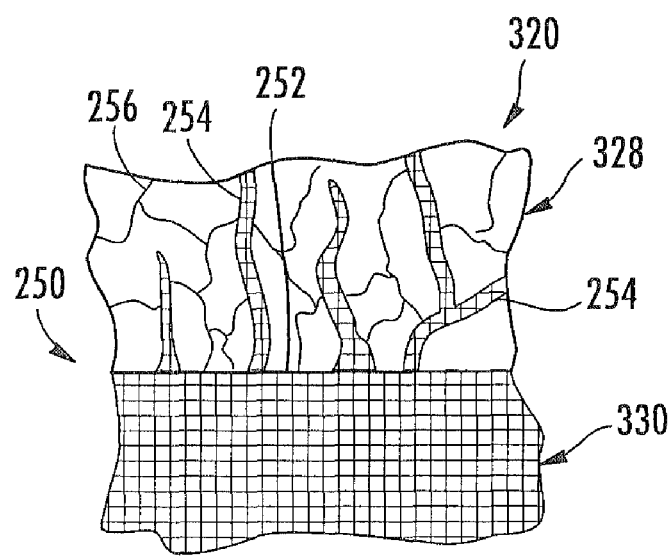
FIG. 7 is an enlarged fragmentary cross sectional view of the component of FIG. 6 taken along line 7-7 according to an example embodiment.

FIGS. 6 and 7 illustrate component 320, another embodiment of component 100 in a stage of formation. Component 320 is similar to component 120 (shown in FIG. 2) except that component 320 includes layers 328 and 330 in place of layers 128 and 130, respectively. Those remaining elements or component structures of component 320 that correspond to structures or elements of component or 120 are numbered similarly.

Layers 328 and 330 are substantially identical to layers 208 and 210 of component 200 (shown and described with respect to FIGS. 4 and 5) but for their relative positioning with respect to the remaining structures or layers of component 320. In particular, rather than extending over channel layer 104 as does layer 208, layer 328 extends beneath channel layer 124 and above gate electrode 132. Rather than extending beneath gate electrode 112 as does layer 210, layer 330 extends over, about and adjacent to gate electrode 132. However, like layers 208 and 210, layers 328 and 330 extend adjacent to one another along interface 250 which is shown in detail in FIG. 7.

As shown in FIG. 7, layer 328 is substantially identical to layer 208 while layer 330 is substantially identical to layer 210. Like layer 208, layer 328 includes defects 254 and 264. Like layer 208, layer 328 has a greater degree of defects 254, 264, a greater degree of crystallinity and a greater specific electrical resistance as compared to layer 330. Like layer 210, layer 330 has a greater degree of water, cations and organometallics, has a greater degree of ligands and has a greater degree of amorphousness (a lower degree of crystallinity) as compared to layer 328. Like Layer 210, layer 330 has a greater concentration of mobile ions. Like layer 210, layer 330 heals the defects or cracks in layer 328 which result from its solidification or curing to synergistically enhance the overall collective specific resistance of layers 328 and 330.

As further shown by FIG. 7, interface 250 between layers 328 and 330 is substantially similar to interface 250 between layers 208 and 210 (shown in FIG. 5) except that defects 254 may not be filled. However, layer 330 provides a relatively continuous/crack-free/defect-free layer for dielectric isolation between gate and source/drain/channel, while layer 328 provides a suitable channel/dielectric interface. As a result, the electrical performance of component 320, comprising a thin-film transistor, is enhanced.

Overall, components 200 and 320 have enhanced channel/gate dielectric interface properties. These enhanced interface properties directly influence performance of components 200 and 320 including, but not limited to, mobility, turn on voltage and stability. The above described process for forming components 200 and 320 may be extended to the use of numerous inorganic/inorganic dielectric combinations. The process provides the ability to select from among various interfacial layer materials (e.g. layer 208) while maintaining dielectric strength and minimizing dielectric loss by overlying the second dielectric layer (e.g. layer to 210). As a result, the process provides unprecedented freedom and tuning and optimizing the electronic properties of the interface to enhance device performance.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible.

For example, unless specifically otherwise noted, the claims reciting a single particular element also encompass a plurality of such particular elements.

What is claimed is:

1. A method comprising:
   forming a first inorganic dielectric layer having a first degree of defects; and
   forming a second inorganic dielectric layer in contact with the first layer and having a second lesser degree of defects;
   forming a first layer of a first solution;
   driving off solvents from the first layer of first solution to a first degree to form the first inorganic dielectric layer;
   forming a second layer of a second solution on the first inorganic dielectric layer; and
   driving off solvents from the second layer of the second solution to a second lesser degree to form the second inorganic dielectric layer.

2. The method of claim 1 further comprising at least partially filling defects of the first inorganic dielectric layer with one or more materials of the second inorganic dielectric layer.

3. The method of claim 1 further comprising ink jet printing the second inorganic dielectric layer onto the first inorganic dielectric layer.

4. The method of claim 1, wherein the first solution and the second solution comprise substantially a same solution and wherein different levels of energy are applied to the first solution and the second solution to drive off different degrees of the solvents.

5. The method of claim 1, wherein the defects comprise crystalline grain boundaries, wherein the first inorganic dielectric layer has a first degree of crystalline grain boundaries and wherein the second inorganic dielectric layer has a second lesser degree of crystalline grain boundaries.

6. The method of claim 5, wherein the second inorganic dielectric layer substantially lacks crystalline grain boundaries.

7. The method of claim 1, wherein the second inorganic dielectric layer at least partially fills defects in the first inorganic dielectric layer.

8. The method of claim 1, wherein the first inorganic dielectric layer has a first degree of ligands remaining at an end of the fabrication process and wherein the second inorganic dielectric layer has a second greater degree of ligands remaining at the end of the fabrication process.

9. The method of claim 1, wherein the first inorganic dielectric layer has a first concentration of mobile ions and wherein the second inorganic dielectric layer has a second greater concentration of mobile ions.

10. The method of claim 1, wherein the first inorganic dielectric layer includes a first degree of organometallics, ions and solvents remaining at an end of the fabrication process and wherein the second inorganic dielectric layer has a second greater degree of organometallics, ions and solvents remaining at the end of the fabrication process.

11. The method of claim 1, wherein the first inorganic dielectric layer has a first degree amorphous character and wherein the second inorganic dielectric layer has a second greater degree of amorphous character.

12. The method of claim 1, wherein the first inorganic dielectric layer and the second inorganic dielectric layer each comprise a homogenous layer of a same inorganic dielectric material.

13. The method of claim 1, wherein the first inorganic dielectric layer has a first specific resistance, wherein the second inorganic dielectric layer has a second greater specific resistance and wherein the first and second layers together have a third specific resistance greater than the first specific resistance.

14. The method of claim 1 further comprising:
    a channel layer in contact with the first inorganic dielectric layer;
    a source electrode in contact with the channel layer; a drain electrode in contact with the channel layer and spaced from the source electrode; and
    a gate electrode opposite the channel layer.

15. The method of claim 14, wherein the first inorganic dielectric layer and the second inorganic dielectric layer separate the gate electrode from the channel layer.

16. The method of claim 15, wherein the first inorganic dielectric layer and the second inorganic dielectric layer space the gate electrode from the source electrode and the drain electrode.

17. The method of claim 1, wherein the first inorganic dielectric layer consists of one or more inorganic dielectric materials and a first amount of any residual solvents and wherein the second inorganic dielectric layer consists of the one or more inorganic dielectric materials and a second greater amount of the any residual solvents.

18. The method of claim 1, wherein each of the defects comprises at least one of a discontinuity, gap, void, pinhole, break or crystalline boundary.

19. A method comprising:
    forming a first inorganic dielectric layer having a first degree of defects; and
    forming a second inorganic dielectric layer in contact with the first layer and having a second lesser degree of defects; and
    at least partially filling defects of the first inorganic dielectric layer with one or more materials of the second inorganic dielectric layer, wherein the defects comprise crystalline grain boundaries, wherein the first inorganic dielectric layer has a first degree of crystalline grain boundaries and wherein the second inorganic dielectric layer has a second lesser degree of crystalline grain boundaries.

20. The method of claim 19, wherein the first inorganic dielectric layer has a first degree of ligands remaining at an end of fabrication and wherein the second inorganic dielectric layer has a second greater degree of ligands remaining at the end of the fabrication.

21. The method of claim 19, wherein the first inorganic dielectric layer has a first degree amorphous character and wherein the second inorganic dielectric layer has a second greater degree of amorphous character.

22. The method of claim 19, wherein the first inorganic dielectric layer has a first concentration of mobile ions and wherein the second inorganic dielectric layer has a second greater concentration of mobile ions.

23. The method of claim 19, wherein the second inorganic dielectric layer substantially lacks crystalline grain boundaries.

24. The method of claim 19, wherein the first inorganic dielectric layer and the second inorganic dielectric layer each comprise a homogenous layer of a same inorganic dielectric material.

25. A method comprising:
    forming a first inorganic dielectric layer having a first degree of defects; and ink jet printing a second inorganic dielectric layer onto and in contact with the first layer and having a second lesser degree of defects.

* * * * *